United States Patent [19]

Vyas

[11] Patent Number: 5,200,648
[45] Date of Patent: Apr. 6, 1993

[54] EMULATOR CIRCUIT AND METHOD FOR GENERATING CMOS LEVEL CLOCK INPUT

[75] Inventor: Hari J. Vyas, San Jose, Calif.

[73] Assignee: National Semiconductor Corporation, Santa Clar, Calif.

[21] Appl. No.: 744,371

[22] Filed: Aug. 13, 1991

[51] Int. Cl.⁵ .......................... H03K 5/00; H03K 5/08
[52] U.S. Cl. .................................. 307/269; 328/35; 307/261
[58] Field of Search .................. 328/35, 36; 307/261, 307/475, 269

[56] References Cited

U.S. PATENT DOCUMENTS

| | | | |
|---|---|---|---|
| 4,638,255 | 1/1987 | Penney | 328/36 |
| 5,030,847 | 7/1991 | Gotoh et al. | 307/265 |
| 5,036,226 | 7/1991 | Tonnu et al. | 307/475 |

*Primary Examiner*—Jin F. Ng
*Assistant Examiner*—Sinh Tran
*Attorney, Agent, or Firm*—Jacques M. Dulin; Thomas C. Feix

[57] ABSTRACT

A method and apparatus for generating a CMOS level clock signal from RC components for use in a microcontroller. The emulator includes an emulation chip and an emulation circuit. The emulation chip includes means for supporting RC clock input to accurately produce a sawtooth wave signal at the point of its connection with the RC network. The emulation circuit includes a comparator which transforms a sawtooth waveform produced by the emulation chip into a square waveform which is then inverted for use as a clock signal for a CMOS level microcontroller. The method includes the steps of emulating a clock signal input of an RC network, comparing the emulated RC signal to a reference signal to generate inverted square wave form output, and inverting the square wave form output for transformation into a CMOS level clock input suitable for use as a clock input for microcontrollers.

19 Claims, 3 Drawing Sheets

EMULATOR CIRCUIT AND METHOD FOR GENERATING CMOS LEVEL CLOCK INPUT

FIELD

The present invention relates generally to emulators for RC networks. In particular, the invention relates to an emulator circuit and method for accurately creating a Complementary Metal-Oxide Semiconductor (CMOS) level clock input, which circuit includes an emulation chip having a Resistor/Capacitor (RC) mask option for supporting RC input. The emulator circuit permits simple and cost effective RC emulation support for microcontrollers.

BACKGROUND

Various types of oscillators have been utilized for some time to form a square wave signal which is used in circuitry as a clock signal. It is desirable to provide a square wave signal microcontroller chip with the ability to support various types of clock inputs including Complementary Metal-Oxide Semiconductor (hereinafter referred to as "CMOS") compatible, crystal and resistor-capacitor (hereinafter referred to as "RC") type clock inputs. Known emulation chips are available and will accept CMOS level clock input. The input from a crystal-type clock can be recreated by using an inverter.

However, it has been found difficult to form such a square wave signal by CMOS devices from the clock input of an RC network, where the CMOS circuits use both n-channel and p-channel devices on the same IC chip, and particularly for subsequent use in a microcontroller. Thus, in particular, it has been difficult to emulate the CMOS circuitry for a first different RC circuit, since a CMOS emulation chip normally only accepts a CMOS level clock input or a crystal type clock, and is not normally compatible with an RC circuit. There are known devices which are able to transform sawtooth waveform signals into square waveform signals, but these devices are not able to maintain the same signal frequency and therefore are not suitable for generating a clock signal for use with microcontrollers.

There is a definite need in the art for an emulator which creates a CMOS level clock input signal from clock input received by RC circuits to provide a microcontroller with complete emulation support.

THE INVENTION

DRAWINGS

The invention is described in greater detail by reference to the drawings in which.

SUMMARY

The present invention comprises an emulator for generating a CMOS level clock from RC components and a method for transforming a low speed clock input signal from an RC network into a square wave form input signal for use as a CMOS level clock signal. In the preferred best mode of the invention, the emulator comprises two emulation chips and an emulation circuit. In operation, the user's RC compatible microcontroller chip is replaced by the emulator which is plugged into the user's circuit board which contains the RC components.

The first emulation chip monitors the signal input from the RC network and accurately creates a sawtooth waveform signal having a frequency responsive to the value of the user's RC components. It has been found that a microcontroller chip having an RC clock input mask option is suitable for this purpose.

The emulation circuit includes a high input impedance circuit, a comparator, and an inverter. The emulation circuit is used for transforming and inverting the sawtooth wave signal into a CMOS level clock input signal. The comparator receives a voltage value from the RC circuit after passing through a resistor element at its (+) or non-inverting input and compares this to a reference voltage received at its (−) inverting input. When the voltage signal formed at the non-inverting (+) input of the comparator is less than that of the voltage signal formed at the inverting (−) input of the comparator, the non-inverting (+) output goes low and the inverting output (−) becomes high. When the voltage signal formed at the non-inverting (+) input is higher than the voltage signal formed at the inverting (−) input, the non-inverting (+) output is high and the inverting (−) output is low.

The inverted square wave signal may then be directed through a serially connected inverter to produce a square wave form signal which may be used as a CMOS level clock signal. The duty cycle of the square wave clock signal may be tuned by providing appropriately selected resistor elements to the reference voltage source for the comparator of the emulation circuit.

The second emulation chip is connected to the output of the inverter and is preferably a microcontroller chip having a CMOS clock input mask option. The second emulation chip performs all the same functions as the user's RC clock input microcontroller.

A separate voltage source is provided to the emulation circuit disposed medial of the inverter and the second emulation chip to boost the amplitude of the CMOS level clock input signal to a compatible level.

DETAILED DESCRIPTION

The following detailed description illustrates the invention by way of example, not by way of limitation of the principles of the invention. This description will clearly enable one skilled in the art to make and use the invention, and describes several embodiments, adaptations, variations, alternatives and uses of the invention, including what I presently believe is the best mode of carrying out the invention.

Figure 1:
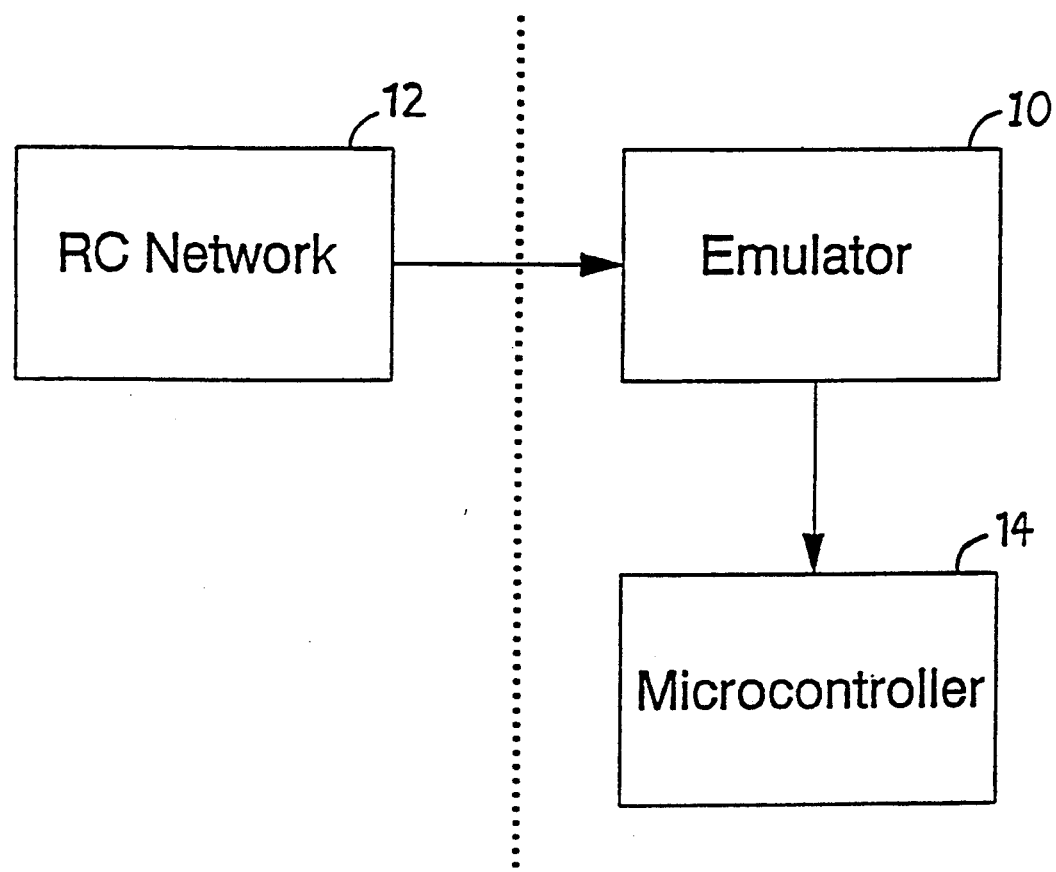
FIG. 1 is a block diagram showing the typical arrangement of an RC network in connection with an emulator and microcontroller of the present invention.

Referring now to FIG. 1, there is disclosed a block diagram showing an emulator of this invention generally designated by reference numeral 10 for an RC network or circuit 12. The emulator 10 receives signal input from the RC 12 network and in turn supplies a clock or square wave signal for a second emulation chip 14. The microcontroller 14 may be independent of the emulator 10 or may be included on the same board as the emulator for convenient packaging. In the past, CMOS level emulation chips have not been compatible with such an RC network 12. In particular a CMOS level microcontroller cannot fully support an RC network since they are not able to form a usable clock signal from an RC network by a CMOS emulator. This is especially a problem when different RC circuits and CMOS circuits are used.

Figure 2:
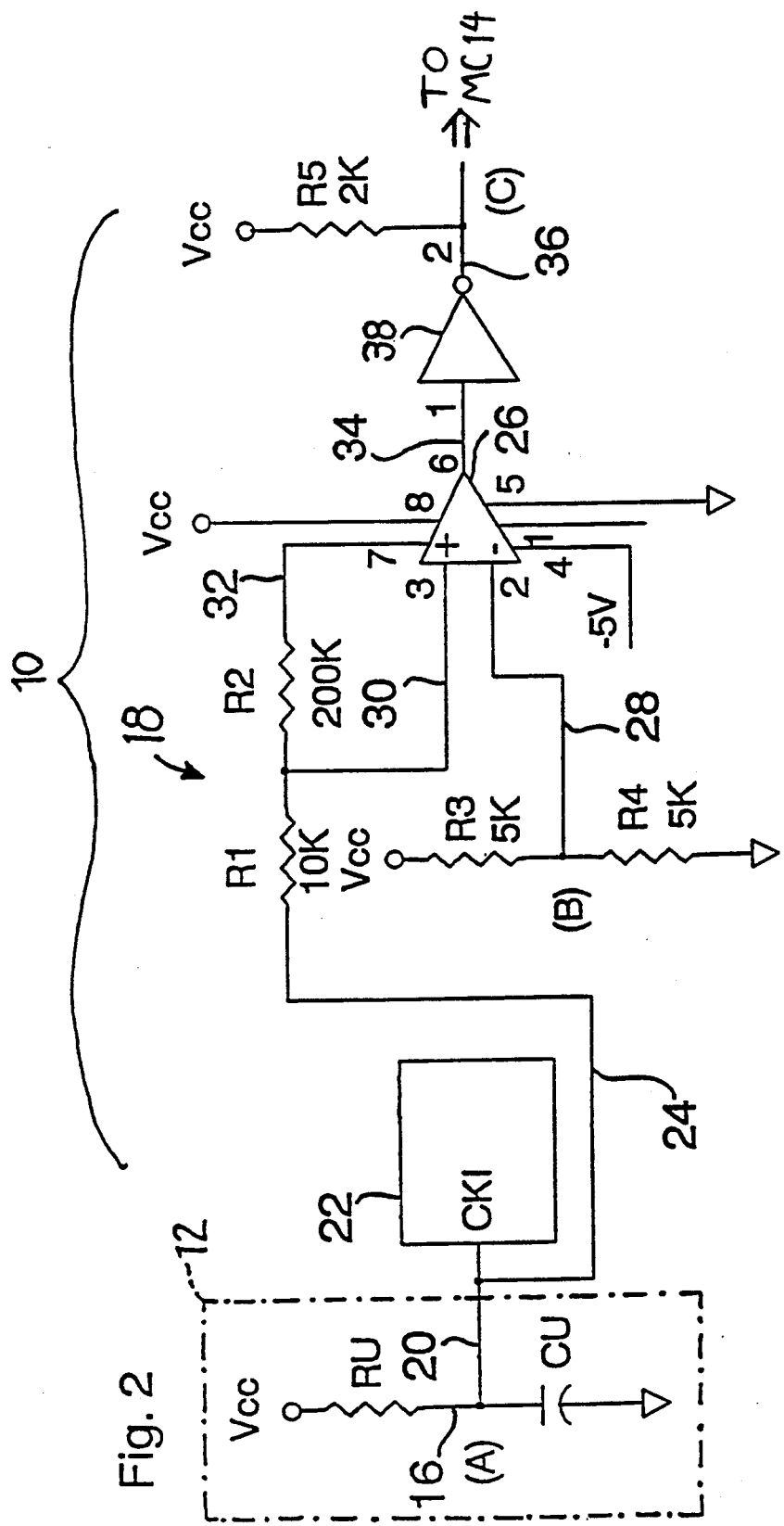
FIG. 2 is a circuit diagram showing an emulation circuit of the emulator connected to an RC circuit.

As shown in FIG. 2, the RC network 12 comprises a resistor RU connected to a power supply $V_{cc}$, and a capacitor CU connected to ground, with the resistor RU being connected to the capacitor CU through a conductive lead 16. The RC network 12 is representative of a manufacturer's RC network and is typically provided on a user's circuit board. The emulator 10 of this invention for the microcontroller 14 is suitable for use in combination with any number of different RC networks 12 and is simply plugged in to the manufacturer's board in place of the user's microcontroller chip.

The emulator 10 comprises a first emulation chip 22 and an emulation circuit 18. The emulation chip 22 includes a pin for clock input (CKI) for connection to the RC network 12 at point (A) by lead 20. In the preferred best mode of the invention, the first emulation chip 22 is a microcontroller chip which includes support for RC mask option. The first emulation chip 22 is connected to point (A) of the RC network 12 at its clock input pin and is used for monitoring the signal input generated by the RC network 12. This results in the accurate production of a sawtooth wave form where the RC network 12 is connected to the emulation chip 22. An example emulation chip having RC mask option is the COP822C available through National Semiconductor Corp., Santa Clara, California. The emulation circuit 18 is also connected to both the first emulation chip 22 and the RC Network 12 by means of lead 24. The emulation chip 22 includes known internal circuit means for generating a sawtooth wave form signal having a frequency responsive to the value of the RC components selected.

In operation, as the capacitor CU charges through the resistor RU from the power supply $V_{cc}$, an RC signal is formed on line 20 to the emulation chip 22 which becomes forward biased when the voltage on line 20 increases a sufficient amount ($V_p$), thus causing the resistance at the RC mask option clock input of the first emulation chip 22 to decrease sharply. When the voltage on line or lead 20 decreases well below the voltage $V_p$, the emulation chip 22 becomes reversed biased again, and cuts off the flow of current, thus causing the capacitor CU to charge again. In this manner, a sawtooth wave form signal is generated at (A) along line 20 connecting the emulation chip 22 to the junction of the resistor RU and the capacitor RU. The sawtooth waveform (A) is shown graphically as a plot of magnitude v. time along the upper time abscissa in the timing diagram of FIG. 3.

As shown in FIG. 2, the sawtooth signal (A) generated by the emulation chip 22 is also connected to a resistor $R_1$ over line or lead 24. In turn, the resistor $R_1$ is connected by line 30 to the (+) input on pin 3 of a high speed differential comparator 26. $R_1$, $R_2$ and pin 3 of the comparator 26 form a high input impedance circuit. The emulator 10 also includes a pair of resistors $R_3$ and $R_4$ for providing a reference signal (B) over the line 28 to the (−) input on pin 2 of the comparator 26. The non-inverting output from pin 7 of the comparator 26 is connected over a lead 32 to a resistor $R_2$ which in turn is connected to the resistor $R_1$ in order to provide feedback for the resistor $R_1$. Of the remaining pins of comparator 26, pin 5 connects to ground, pin 4 connects to a power source (−5V) and pin 1 is left unconnected. Thus, when the voltage from the resistor $R_1$ on the (+) non-inverting input of the comparator 26 exceeds the reference voltage (B) on the (−) inverting input of the comparator 26, a high signal is formed on pin 7 of the comparator 26. When the voltage of the (+) input of the comparator 26 is less than the reference voltage (B) at the (−) input of the comparator 26, a low signal is formed on the output at pin 7 of the comparator 26. The inverting output at pin 6 is connected to pin 1 of inverter 38 by line 34. When the two signals at the (+) input and (−) input are equal the output at pin 6 of the comparator is zero. In this manner, the sawtooth wave signal (A) supplied to the resistor $R_1$ is transformed by the comparator 26 to a square wave or clock signal on pin 7 of the comparator 26 supplied to the resistor $R_2$.

With further reference to FIG. 2, the square wave output signal formed by the comparator 26 is inverted and supplied in inverted form on pin 6 of the comparator 26. The inverted signal is supplied to an inverter 38 via line 34 which inverts the signal to form a square wave or clock signal (C) on line 36 which is supplied to the second emulation chip 14, previously discussed in connection with FIG. 1. The second emulation chip 14 is preferably a microcontroller chip having a CMOS clock input mask option and is included on the emulator board in its own physical packaging. The second emulation chip 14 has full I/0 capability and performs all the function of the user's RC type microcontroller chip but unlike the user's chip, the second emulation chip 14 supports CMOS level clock input. In order to boost the clock signal to a desired level, the emulator circuit 18 may also include a resistor $R_5$ which is connected between the power supply $V_{cc}$ and the line 36. Typical values for the resistors $R_1$, $R_2$, $R_3$, $R_4$, and $R_5$ are set forth in the drawing.

Figure 3:
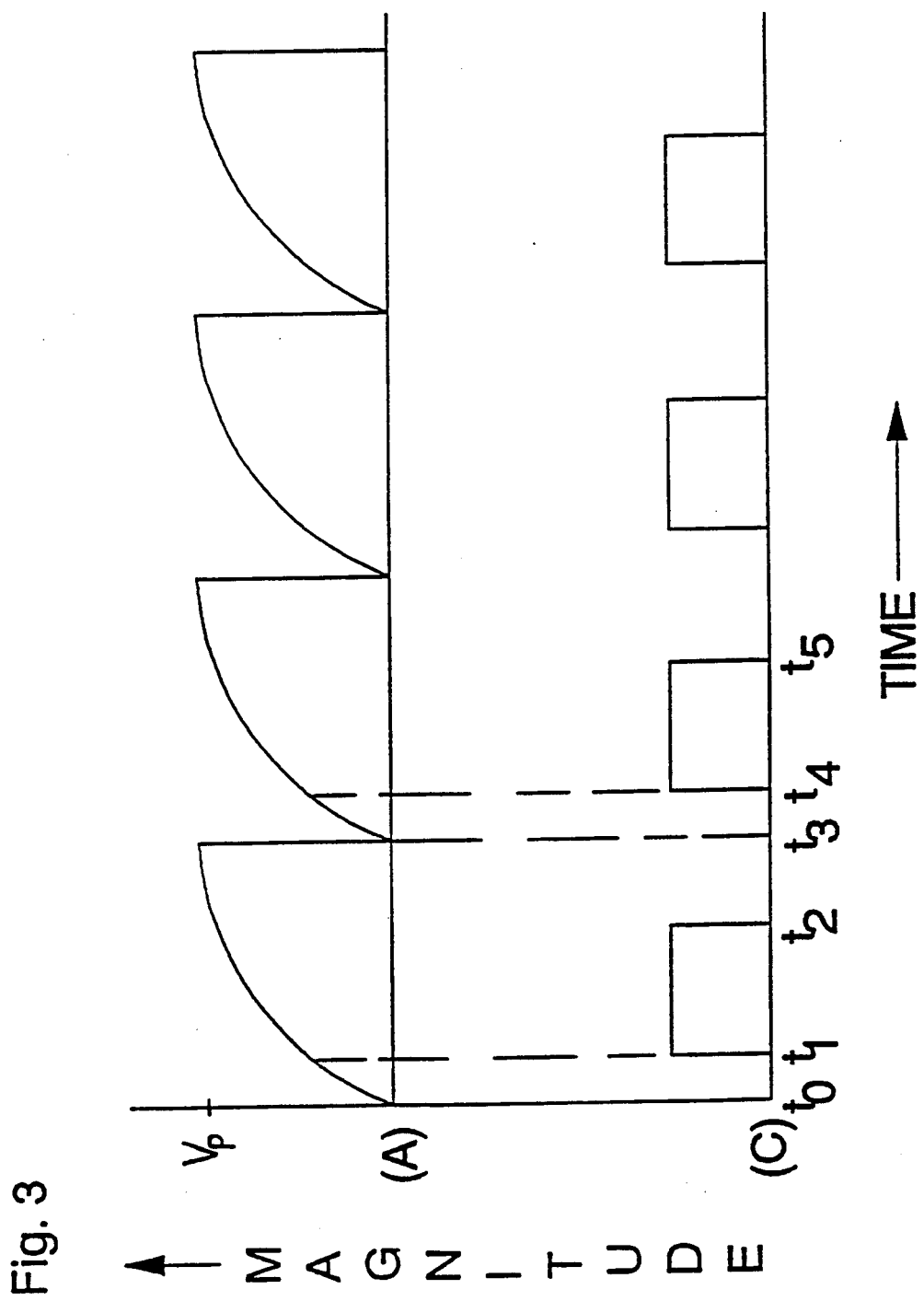
FIG. 3 is a timing diagram of the clock signals in the emulator of the present invention.

A timing diagram of the sawtooth signal (A) and the resulting square wave signal (C) is shown in FIG. 3. As shown, the sawtooth wave (A) rises smoothly from the time $t_0$ to the time $t_3$ where it vanishes rapidly, with the pattern being repeated periodically during a suitable period of time, such as 600 nanoseconds (nsecs). In turn, the clock signal rises sharply at the times $t_1$ and $t_4$ which times are slightly later than the respective times $t_0$ and $t_3$ associated with the sawtooth signal (A), and then sharply drops at the respective times $t_2$ and $t_5$, which pattern is repeated in order to form a pulse train for the clock signal (C). A typical time period between the times $t_1$ and $t_4$ may be approximately 600 nanoseconds (nsecs) for the repetition of the pulses. A typical time period for each pulse between the times $t_1$ and $t_2$ and between the times $t_4$ and $t_5$ ma be approximately 300 nanoseconds (nsecs.), and a typical time period $t_2$ to $t_4$ between pulses may be approximately 300 nanoseconds (nsecs.)

In this manner, the CMOS emulator of the present invention forms a square wave signal from an RC network, where the emulator and RC circuits were not previously compatible to achieve this result. The duty cycle of the square wave signal may be modified by appropriately tuning the resistors $R_3$ and $R_4$. In this manner, the square wave signal may be modified, if desired.

The foregoing detailed description has been given for clearness of understanding only, and it should be understood that various modifications within the scope of this invention can be made by one of ordinary skill in the art without departing from the spirit thereof. I therefore wish my invention to be defined by the scope of the appended claims in view of the specification as broadly as the prior art will permit.

I claim:

1. An emulator for generating a CMOS level clock signal from a provided set of RC components comprising:
   a) microcontroller means for generating a sawtooth wave form clock input signal from a provided RC network; and
   b) an emulation circuit responsive to said sawtooth wave form signal for forming a square wave output signal having a frequency equal to a frequency of said sawtooth wave form signal.

2. An emulator as in claim 1 wherein:
   a) said emulation circuit is connected to the junction of a resistor and a capacitor of said provided RC network.

3. An emulator as in claim 2 wherein said emulation circuit includes:
   a) means for comparing said sawtooth waveform signal with a reference signal to form a square waveform signal; and
   b) means for modifying said square wave form signal received from said comparing means to provide an output signal usable as a CMOS level clock signal.

4. An emulator as in claim 3 wherein said comprising means is a comparator having a (+) non-inverting input responsive to said sawtooth waveform signal and a (−) inverting input responsive to said reference voltage, said emulation circuit further includes:
   a) a high input impedance circuit disposed connected between of said sawtooth waveform generating means and said (+) non-inverting input of said comparator.

5. An emulator as in claim 4 wherein said emulation circuit includes means for tuning the duty cycle of said square waveform signal formed by said comparing means.

6. An emulator as in claim 5 wherein said tuning means provides said reference signal.

7. An emulator for generating a CMOS level clock signal from RC components comprising in operative combination:
   a) a first emulation chip for accurately generating a sawtooth waveform form signal from a provided RC network signal input;
   b) a CMOS emulation circuit responsive to said first emulation chip for forming a square waveform signal, said CMOS emulation circuit having circuit elements including:
      i) a first resistor;
      ii) a comparator;
      iii) means for connecting said first resistor between a resistor-capacitor junction of an RC network and a (+) non-inverting input of said comparator;
      iv) a second resistor;
      v) means for directing non-inverting signal output of said comparator through said second resistor to provide feedback to said (+) non-inverting input;
      (vi) a reference voltage connected to a (−) inverting input of said comparator;
      vii) an inverter connected to an output of said comparator; and
   c) said circuit elements of said CMOS emulation circuit having parameters selected so that, when said CMOS emulation circuit is connected to said first emulation chip at said resistor-capacitor junction, said sawtooth waveform input signal generated by said RC network is formed into a square wave CMOS level clock signal at the output of said inverter.

8. An emulator as in claim 7 wherein said CMOS emulation circuit includes means for tuning the duty cycle of said square wave form signal.

9. An emulator as in claim 8 wherein said tuning means includes:
   a) a third and fourth resistor, connected in series to provide said reference voltage source; and
   b) means for connecting said (−) inverting input of said comparator to a junction of said serially connected resistors.

10. An emulator as in claim 7 wherein said first emulation chip is a microcontroller having an RC clock input mask option.

11. An emulator as in claim 10 further including:
    a) a second emulation chip responsive to said CMOS level clock signal generated by said inverter; and
    b) said second emulation chip including support for a CMOS level clock for emulating all the functions of a dedicated microcontroller chip having RC clock input mask option originally intended for use with said provided RC network.

12. A method for transforming signal input provided by an RC network into a CMOS clock input signal, including the steps of:
    a) providing a first emulation chip having an RC Mask option for accurately generating a sawtooth waveform clock signal from a provided RC network;
    b) providing a high input impedance circuit including a comparator for comparing the generated sawtooth waveform clock signal to a reference signal in which all non-inverting output of said comparator is connected to said generated sawtooth waveform clock signal for feedback, and all inverting output signal of said comparator is in square waveform;
    c) providing means for inverting said square waveform output into square waveform input suitable for use as a CMOS level clock signal;
    d) providing means for tuning said reference signal to provide a variable duty cycle associated with said inverted square wave output signal; and
    e) providing a second emulation chip having means for performing all functions of a user's program responsive to said signal received from said RC network.

13. A method for transforming signal input associated with a provided RC network and an emulation circuit into a CMOS clock input signal, comprising the steps of:
    a) accurately generating a sawtooth waveform signal using said a provided RC network; and said emulation circuit
    b) comparing said sawtooth wave form signal with a second reference signal to generate inverting output signals in square wave form and non-inverting output signals in square wave form; and
    c) feeding back said non-inverting output signals to said sawtooth waveform signal.

14. A method as in claim 13, including the step
    a) tuning the duty cycle of said inverted square waveform signal output.

15. A method as in claim 14, including the step of:

a) inverting said inverted square wave form output signal to provide a CMOS level clock signal suitable for use as an input signal for a microcontroller.

16. A method as in claim 15, including the step of:
a) boosting said square waveform output signal to a CMOS compatible clock input level.

17. An emulator for generating a CMOS level clock signal from RC components comprising:
a) means for generating a sawtooth waveform clock input signal from RC network signal input, said sawtooth waveform generating means disposed connected to the junction of a resistor and a capacitor of said provided RC network;
b) an emulation circuit responsive to said sawtooth waveform signal for forming a square wave output signal having a frequency equal to a frequency of said sawtooth wave form signal, and wherein said emulation circuit includes:
 i) means for comparing said sawtooth waveform signal with a reference signal to form a square wave form signal, said comparing means includes a comparator having a (+) non-inverting input responsive to said sawtooth waveform signal and a (−) inverting input responsive to said reference voltage;
 ii) a high input impedance circuit disposed connected between of said sawtooth waveform generating means and said (+) non-inverting input of said comparator; and
 iii) means for modifying said square waveform signal received from said comparing means to provide a output signal usable as a CMOS level clock signal.

18. An emulator as in claim 17 wherein said emulator includes means for tuning the duty cycle of said square wave form signal formed by said comparing means.

19. An emulator as in claim 18 wherein said tuning means provides said reference signal.

* * * * *